United States Patent
Sudoh et al.

(10) Patent No.: US 7,193,403 B2
(45) Date of Patent: Mar. 20, 2007

(54) CURRENT DRIVER

(75) Inventors: Atsushi Sudoh, Saitama (JP); Yoshinori Okada, Oita (JP); Seiji Murakami, Oita (JP); Atsuhiro Miwata, Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/353,332

(22) Filed: Feb. 14, 2006

(65) Prior Publication Data

US 2006/0181259 A1 Aug. 17, 2006

(30) Foreign Application Priority Data

Feb. 14, 2005 (JP) .............. 2005-035917

(51) Int. Cl.
G05F 3/08 (2006.01)
G05F 3/16 (2006.01)

(52) U.S. Cl. .............. 323/313; 327/539; 327/538; 327/535

(58) Field of Classification Search .......... 323/313, 323/312; 327/535, 539, 537, 538
See application file for complete search history.

(56) References Cited

U.S. PATENT DOCUMENTS

| | | | | |
|---|---|---|---|---|
| 5,479,091 A | * | 12/1995 | Chloupek | 323/312 |
| 5,703,477 A | * | 12/1997 | Punzenberger | 323/313 |
| 6,147,479 A | * | 11/2000 | Lee | 323/313 |
| 6,323,631 B1 | * | 11/2001 | Juang | 323/315 |
| 6,922,045 B2 | * | 7/2005 | Self et al. | 323/313 |
| 7,129,773 B2 | * | 10/2006 | Ito et al. | 327/538 |

* cited by examiner

*Primary Examiner*—Bao Q. Vu
(74) *Attorney, Agent, or Firm*—William B Kempler; W. James Brady; Frederick J. Telecky, Jr.

(57) ABSTRACT

A current driver that can control variation in the consumed current in conjunction with variation in the setting value of the driving current. The mirror current of transistors Q2-0 to Q2-7 at each of output circuits 10-1 to 10-160 keeps flowing through output terminal To1 or node N8 irrespective of the setting value of the pixel data. Also, the mirror current of transistor Q4D keeps flowing in the series circuit of transistors Q4D and Q5D irrespective of the setting value of the pixel data. Consequently, even when the setting value of the driving current varies in various ways, the current consumed in each output circuit can still be kept constant. As a result, it is possible to prevent variation in the voltage of the power supply line in conjunction with variation of the consumed current, and it is possible to reduce fluctuation in the driving current between output channels.

20 Claims, 7 Drawing Sheets

CURRENT DRIVER

The present invention pertains to a type of current driver for driving pixels of display panels, etc.

BACKGROUND

FIG. 7 is a diagram illustrating an example of the constitution of a current driver IC in the prior art for driving an active type EL panel. This current driver IC has 160 output channels, and it outputs driving currents having 256-step levels according to 8-bit pixel data from the various output channels to the pixels of the display panel. The current driver IC shown in FIG. 7 has current source CS2, n-type MOS transistor Qc1, output circuits U-i, . . . , U-160, output terminals To1, To2, To3, . . . , and control terminal T1.

The terminal on one side of current source CS2 is connected to control terminal T1, and the terminal on the other side is connected to the drain of transistor Qe1. Control terminal T1 is connected via externally connected resistor R2 to power supply voltage AVDD. Current source CS2 outputs reference current Iref according to externally connected resistor R2 to the drain of transistor Qc1. The gate and drain of transistor Qc1 are connected to common node Nd, and its source is connected to reference potential AVSS. Output circuit U-1 (here, 1 represents any integer in the range of 1–160) has n-type MOS transistors Qa0–Qa7, and n-type MOS transistors Qb0–Qb7.

Transistors Qa0–Qa7 form a current mirror circuit together with transistor Qc1. The gates of transistors Qa0–Qa7 are connected to common node Nct, and their sources are connected to reference potential AVSS. The ratios of the sizes of transistors Qa0–Qa7 are proportional to powers of 2. That is, the size of transistor Qa1 is twice that of transistor Qa0; transistor Qa2 is 4 times the size of transistor Qa0; transistor Qa3 is 8 times the size of transistor Qa0; transistor Qa4 is 16 times the size of transistor Qa0; transistor Qa5 is 32 times the size of transistor Qa0; transistor Qa6 is 64 times the size of transistor Qa0; and transistor Qa7 is 128 times the size of transistor Qa0.

Transistors Qb0–Qb7 form switches that connect the drains of transistors Qa0–Qa7 to output terminal To1. The drain of transistor Qaj (where j is any integer in the range of 0–7) is connected via transistor Qbj to output terminal To1. Bit signal bj is input to the gate of transistor Qbj. When bit signal bj is "1" (high level), transistor Qbj is ON, and, when bit signal bj is "0" (low level), transistor Qbj is OFF.

With this constitution, reference current Iref according to the resistance value of externally connected resistor R2 flows in current source CS2. As reference current Iref flows to transistor Qc1, the gate voltage of transistor Qc1 according to the reference current Iref is generated at node Nc1.

The voltage generated at node Nd is commonly applied to the gates of transistors Qa0–Qa7. Because transistors Qa0–Qa7 have a size ratio proportional to powers of 2, 8 types of currents with power of 2 weighting (×1, ×2, ×4, ×8, ×16, ×32, ×64, ×128) flow in the transistors. Transistors Qb0–Qb7 are set ON/OFF according to the 8-bit pixel data {b0, . . . , b7}. As a result, the currents among the 8 types of currents with power of 2 weighting selected according to the pixel data {b0, . . . , b7} are synthesized at output terminal To1, and the obtained current is fed to the pixel as driving current. Because the driving current has a 256-step magnitude according to the 8-bit pixel data, using it in driving the pixel makes it possible to adjust the luminance of the pixel to 256 levels.

With current driver IC shown in FIG. 7, however, when transistor Qbj is switched from ON to OFF, the current path of transistor Qa1 is completely cut off Consequently, when the pixel data of the various output channels are set at various values, the current consumed in output circuits U-1 to U-16 are also changed to various values. Because variation of the consumed current causes variation in the voltage of the power supply line, fluctuation occurs in the driving current between output channels. Also, when plural current driver ICs are used to drive a single display panel, because the currents consumed by the different ICs are different, the voltage of the power supply line for each IC varies, and fluctuation occurs in the driving current between ICs. When fluctuation occurs in the driving current, fluctuation in luminance, lines, etc., occur in the picture, so that the image quality is degraded. This is undesirable. For example, assuming a certain IC displays white for all of the pixels, while the adjacent IC displays black for all of the pixels, and then the next adjacent IC displays white for all of the pixels, the output currents of the first and third ICs become the maximum, and the output current of the second IC becomes zero.

Also, for current driver IC shown in FIG. 7, when transistor Qbj is switched ON/OFF, the drain voltage of transistor Qaj also varies. For example, as shown in FIG. 8, when bit signal b7 (FIG. 8(A)) is set at the high level, the voltage of node Na7 rises to a certain voltage, and this voltage is held during the period of output of driving current to the pixel. However, when bit signal b7 changes from the high level to the low level, because transistor Qb7 is OFF, transistor Qa7 cannot maintain a constant current, and the voltage of node Na7 falls to reference potential AVSS. Consequently, the voltage of node Na7 varies significantly when transistor Qb7 is switched ON/OFF (FIG. 8(B)).

Because the drain voltage of transistors Qb0–Qb7 varies as described, the voltage of node Nd varies due to the influence of the parasitic capacitance between drain and gate (FIG. 8(C)). The voltage of node Nd influences the output current of each output channel. Consequently, since the voltage varies, the time needed to stabilize the driving current increases, and this is undesirable. Variation in the voltage of node Nd is greatest when all of transistors Qbj are turned ON/OFF at the same time. Also, in conjunction with increased precision of the gradation data of 8 bits or higher and increase in the number of output transistors Qaj, the load of node Nc I increases, and more time is needed to stabilize the driving current. In order to solve this problem, it has been proposed that the size of transistor Qc1 that forms the current mirror circuit be made larger to increase the ratio of transistors Qc1 and Qaj. However, this leads to an increase in reference current Iref and in the size of the layout area.

A general object of the present invention is to solve the aforementioned problems of the prior art by providing a type of current driver that can control variation in the voltage and consumed current of node Nd in conjunction with variation in the setting value of the driving current.

SUMMARY

The first aspect of the present invention provides a type of current driver characterized by the fact that it has plural output circuits that output driving currents, respectively, and each output circuit has a first node that outputs the driving current, a first constant current circuit that has plural current output nodes for output of a prescribed current, plural first switches, which are connected between the current output nodes of the first constant current circuit and the first node, and which are turned ON/OFF according to the setting signal of the driving current, a voltage output circuit, and plural second switches, which are connected between the current output nodes of the first constant current circuit and the voltage output node of the voltage output circuit, and which are turned ON when the first switch connected to a common current output node is OFF, and are turned OFF when the first switch is ON.

The following scheme can be adopted for this current driver: the voltage output circuit has a first constant voltage node that applies a constant voltage, a load circuit, which is connected between the first constant voltage node and the voltage output node, and which generates a voltage corresponding to the current flowing between the nodes, and a second constant current circuit that outputs a prescribed current to the voltage output node at the same polarity as that of the current output from the first constant current circuit via the second switch to the voltage output node. In this case, the load circuit may contain one or several series-connected first transistors, which are connected between the first constant voltage node and the voltage output node, and which have a prescribed bias voltage input to their control terminals.

Also, the current driver of the present invention can also have a second transistor, which is inserted in the wiring for connecting the current output node of the first constant current circuit and the first node, and which has a prescribed bias voltage input to its control terminal, and the first transistor and the second transistor can have a higher voltage rating between terminals than the transistors that form the first constant current circuit and the second constant current circuit. The first transistor and the second transistor can have a common bias voltage input to their control terminals. The first constant current circuit and the second constant current circuit are contained in a common current mirror circuit that generates output current at the current output nodes corresponding to the input current. In this case, the current driver circuit of the present invention may have an input node for a reference current and a third transistor, which is connected between the current input node of the current mirror circuit and the input node of the reference current, which has its control terminal connected to the input node of the reference current, and which has a voltage rating between terminals higher than that of the transistors that form the current minor circuit. The first transistor and the second transistor can have the voltage generated at the control terminal of the third transistor input as the bias voltage. The load circuit may contain a resistor element connected between the first constant voltage node and the voltage output node. The voltage output circuit may contain a first constant voltage node and a second constant voltage node, each having a prescribed voltage applied to them, a first resistor element connected between the first constant voltage node and the voltage output circuit, and a second resistor element connected between the voltage output node and the second constant voltage node. The voltage output circuit can keep the output voltage constant.

The second aspect of the present invention provides a type of current driver characterized by the following facts: the current driver has a current supply terminal, a reference current source that generates a reference current, a first transistor to which the reference current is input, a second transistor that is connected to the first transistor and supplies a current having a prescribed relationship with the current flowing in the first transistor, plural third transistors each connected to the first transistor and supplying a current having a prescribed relationship to the current flowing in the first transistor, plural first switching elements arranged in the plural current paths between the current supply terminal and the plural third transistors, respectively, and turned ON/OFF according to the output data, and plural second switching elements arranged between the plural current paths, which are between the current supply terminal and the plural third transistors, and the current path of the second transistor; the plural first switching elements and the plural second switching elements in corresponding relationship with each other, respectively, are turned ON/OFF in a complementary way according to the output data.

As a preferred scheme, the first transistor, the second transistor, and the plural third transistors form a current mirror circuit. The currents that can be fed to the plural third transistors can be currents corresponding to the gradation data. The current driver pertaining to the second concept may have a fourth transistor arranged in the current path of the first transistor, a fifth transistor arranged in the current path of the second transistor, and a sixth transistor arranged in the current path of the current supply terminal. The fourth, fifth and sixth transistors may form a current mirror circuit. The plural first and second switching elements can each be composed of transistors. The first, second and third transistors can be transistors with a low voltage rating, and the fourth, fifth and sixth transistors can be transistors with a high voltage rating.

REFERENCE NUMERALS AND SYMBOLS AS SHOWN IN THE DRAWINGS

In the FIGS. 10, 10A, 10B, 10C represent driving current generators, 10-1 to 10-160, B0A-1 to 10A-160, 10B-1 to 10B-160, bC-1 to b0C-160 output circuits, 11 a constant current circuit, 20 a reference current generator, 30, 40 latch circuits, 50 a shift register, T1, T2, To1–To160 terminals, R1, R2, R3 resistors, Q1R, Q2D, Q2-0 to Q2-7, Q3-0 to Q3-7, Q4D, Q4-0 to Q4-7, Q9R, Q9D, Q9B n-type MOS transistors with high voltage rating, Q5D, Q10D p-type MOS transistors with high voltage rating, and Q6D, Q6-0 to Q6-7, Q7-0 to Q7-7, Q8D, Q8-0 to Q8-7 n-type MOS transistors with low voltage rating.

DETAILED DESCRIPTION OF THE EMBODIMENTS

According to the present invention, even when the setting value of the driving current varies, there is still no variation in the current consumed. Consequently, it is possible to control variation in the voltage of the power supply line, and it is possible to reduce fluctuation in the driving current between the output channels.

Figure 1:
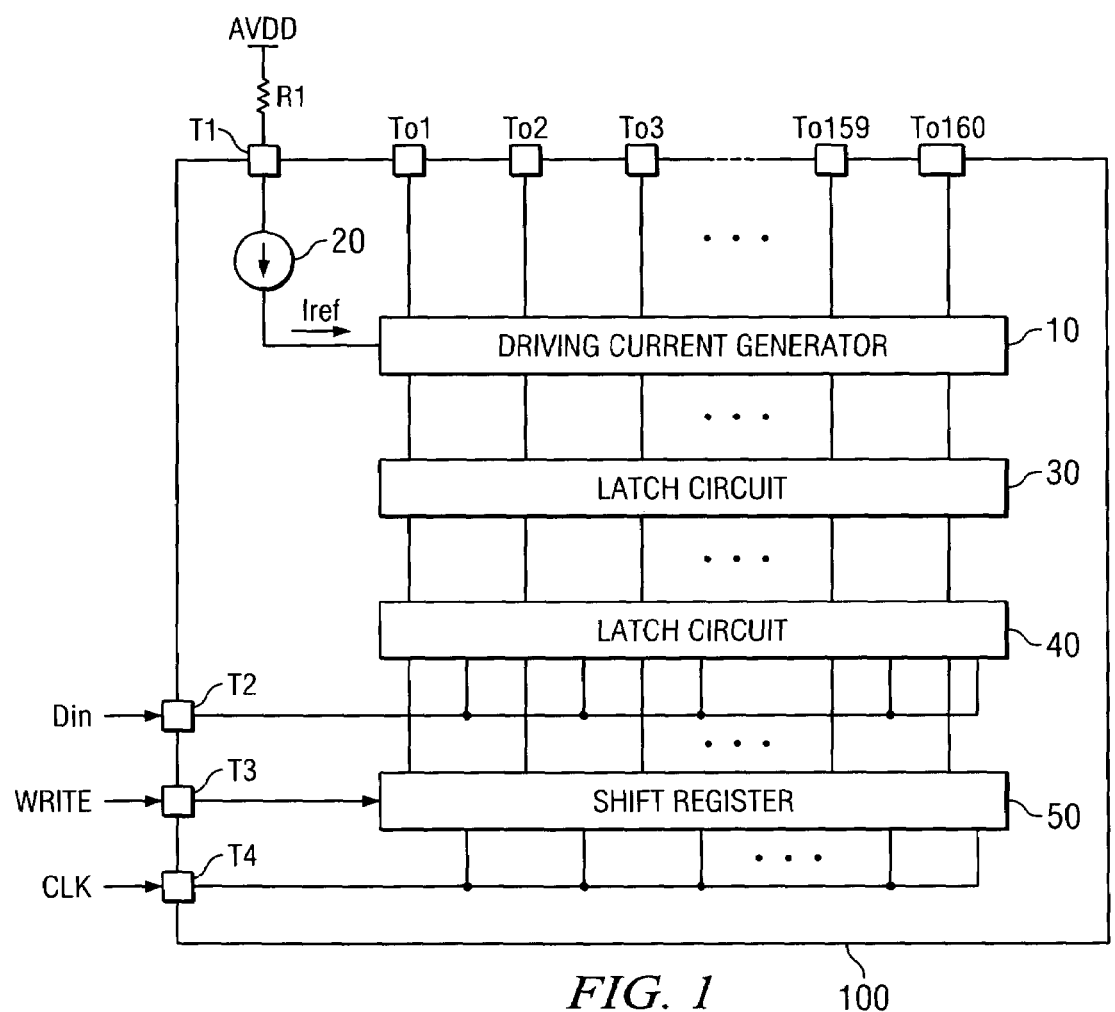
FIG. 1 is a diagram illustrating an example of the constitution of the current driver pertaining to an embodiment of the present invention.

FIG. 1 is a diagram illustrating an example of the constitution of current driver 100 pertaining to an embodiment of the present invention. In FIG. 1, current driver 100 is a circuit for current driving of the pixels of an organic EL panel or other display panel, and it has 160 output channels (first to $_{160}$th output channels).

The current driver 100 shown in FIG. 1 has the following parts: driving current generator 10, reference current generator 20, latch circuits 30 and 40, shift register 50, driving current output terminals To1–To160, terminal Ti connected to externally connected resistor Rb, and terminal T2 to which pixel data is input. The shift register 50 sequentially shifts the write pulse (WRITE) input to terminal T3 corresponding to clock signal CLK input to terminal T4 to generate data write pulses according to the first to $_{160}$th output channels, respectively, and outputs the pulses to latch circuit 40. The latch circuit 40 responds to the data write pulses output from shift register 50 corresponding to the first to 160th output channels, respectively, to sequentially fetch and latch the pixel data of 160 channels, that is, the first to $_{160}$th output channels, serially input from terminal T2, and outputs them to latch circuit 30. When driving of a given horizontal scanning line on the display screen ends and the next horizontal scanning line is driven, the latch circuit 30 latches the 160 pixel data output from latch circuit 40, and outputs them to driving current generator 10.

Standard current generator 20 generates standard current Iref corresponding to the resistance value of the external resistor which is connected between terminal Tb and supply voltage AVDD, and supplies it to driving current generator 10. The driving current generator 10 outputs driving currents corresponding to the 160 pixel data kept in latch circuit 30 to output terminals To1–To160, respectively. Also, it sets the reference value of the driving current based on reference current Iref sent to it.

Figure 2:
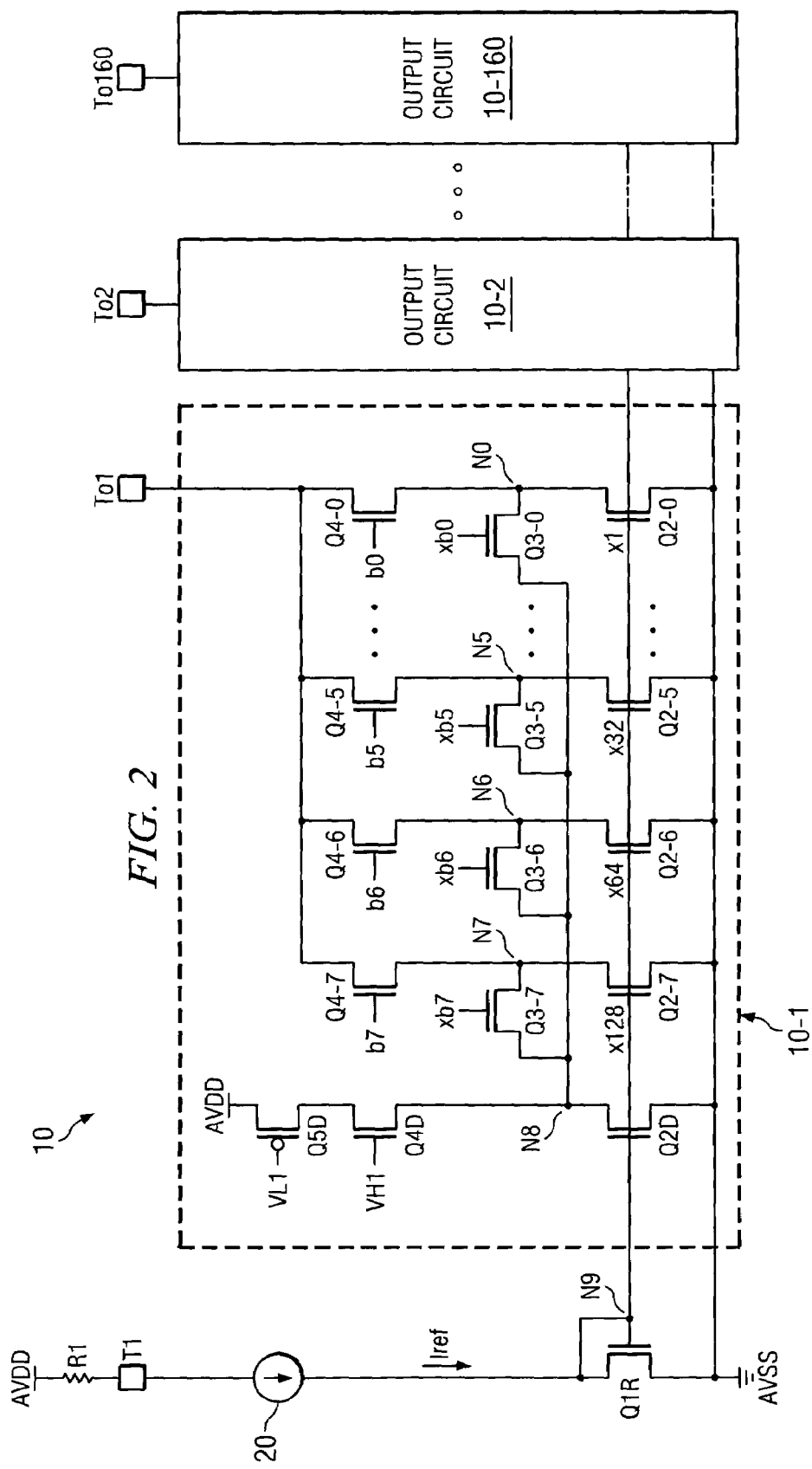
FIG. 2 is a diagram illustrating an example of the constitution of the driving current generator in the current driver in Embodiment 1.

FIG. 2 is a diagram illustrating an example of the constitution of driving current generator 10. The driving current generator 10 shown in FIG. 2 has output circuits 10-b, 10-160 and n-type MOS transistor Q1R. The output circuits 10-1 to 10-160 have n-type MOS transistors Q2-0, . . . , Q2-7, Q3-0, . . . Q3-7, Q4-0, . . . , Q4-7, Q2D, Q4D, and p-type MOS transistor Q5D. Also, output circuits 10-1 to 10-160 pertain to an embodiment of the output circuit of the present invention. Terminals To1–To160 pertains to an embodiment of the first node of the present invention. N-type MOS transistors Q2-0 to Q2-7 pertain to an embodiment of the first constant current circuit of the present invention. N-type MOS transistors Q4-0 to Q4-7 pertain to an embodiment of the first switch of the present invention. N-type MOS transistors Q3-0 to Q3-7 pertain to an embodiment of the second switch of the present invention.

The circuit containing n-type MOS transistors Q2D, Q4D and p-type MOS transistor Q5D is an embodiment of the voltage output circuit of the present invention. The circuit containing n-type MOS transistor Q2D and p-type MOS transistor Q5D is an embodiment of the load circuit of the present invention.

N-type MOS transistor Q2D pertains to an embodiment of the second constant current circuit of the present invention. N-type MOS transistor Q2D and p-type MOS transistor Q5D pertain to an embodiment of the first transistor of the present invention. In the example shown in FIG. 2, the case in which the voltage fed to the pixel is set relatively, to about 10 V, is assumed, and MOS transistors with a high voltage rating are used as the various transistors Q1R, Q2-0 Q2-7, Q3-0, . . . , Q3-7, Q4-0, . . . Q4-7, Q2D, Q4D, Q5D. The drain and gate of transistor Q1R are connected to common node N9, and its source is connected to reference potential AVSS. Reference current Iref generated by reference current generator 20 is input to node N9.

Output 10-1 (where 1 represents any integer in the range of 1–160, and the same in the following) outputs a driving current to output terminal To1 of the 1th output channel. That is, a driving current having 256-step levels is generated according to the 8-bit pixel data of the 1th output channel kept in latch circuit 30, and it is output to output terminal To1. The gates of transistors Q2-0 to Q2-7, Q2D are connected to common node N9, and their sources are connected to reference potential AVSS. Transistors Q2-0 to Q2-7 have size ratios proportional to powers of 2. That is, transistor Q-2-1 is twice the size of transistor Q2-0, transistor Q2-2 is 4 times the size of transistor Q2-0, transistor Q2-3 is 8 times the size of transistor Q2-0, transistor Q2-4 is 16 times the size of transistor Q2-0, transistor Q2-5 is 32 times the size of transistor Q2-0, transistor Q2-6 is 64 times the size of transistor Q2-0, and transistor Q2-7 is 128 times the size of transistor Q2-0. Transistors Q2-0 to Q2-7, Q2D and transistor Q1R contained in output circuits 10-1 to 10-b60 form a current mirror circuit that generates plural output currents corresponding to reference current Iref. Consequently, transistors Q2-0 to Q2-7 have currents with current ratios the same as the size ratios. That is, the current of transistor Q-2-b is twice that of transistor Q2-0, the current of transistor Q2-2 is 4 times that of transistor Q2-0, the current of transistor Q2-3 is 8 times that of transistor Q2-0, the current of transistor Q2-4 is 16 times that of transistor Q2-0, the current of transistor Q2-5 is 32 times that of transistor Q2-0, the current of transistor Q2-6 is 64 times that of transistor Q2-0, and the current of transistor Q2-7 is 128 times that of transistor Q2-0. Transistor Q4-j (where j is any integer in the range of 0–7, and the same in the following) is connected between the drain of transistor Q2-j and output terminal To1.

1-bit signal bj contained in the 8-bit pixel data {b0, . . . , b7} is input to the gate of transistor Q4-j. Transistor Q4-j is ON when bit signal bj is "I" (high level), and it is OFF when bit signal bj is "0" (low level).

Transistor Q3-j is connected between node Nj connected to the drain of transistor Q2-j and node N8 connected to the drain of transistor Q2D. Bit signal xbj is input to the gate of transistor Q3-j. Bit signal xbj is the logic NOT signal of bit signal bj. Bit signal xbj is "0" when bit signal bj is "1," and bit signal xbj is "1" when bit signal bj is "0." Transistor Q3-j ON when bit signal xbj is "1" (high level), and it is OFF when bit signal xbj is "0" (low level). Consequently, transistor Q3-j is ON when transistor Q4-j connected to common node Nj is OFF, and is OFF when the transistor Q4-j is ON.

Transistors Q4D and Q5D are connected in series between node N8 and power supply voltage AVDD. Voltage YH1 is input to the gate of transistor Q4D, and voltage VL1 is input to the gate of transistor Q5D. The voltage VH1 is a voltage set at, for example, power supply voltage AVDD, to turn transistor Q4D ON. Also, voltage VL1 is a voltage set at, for example, reference potential AVSS, to turn transistor QSD ON. The mirror current output from transistor Q2D to node N8 has the same polarity as that of the mirror current output from transistor Q2-j via transistor Q3-j to node N8. Consequently, a current that is a sum of the mirror currents flows in the series circuit of transistors Q4D and Q5D connected between node N8 and power supply voltage AVDD.

In the following, the operation of the current driver in the present embodiment with this constitution will be explained. Latch circuit 40 sequentially reads and latches the pixel data of the first to $_{160}$th output channels input in series from terminal T2 corresponding to the data write pulses for the 160 output channels generated in shift register 50. When driving of the current horizontal scanning line ends and the next horizontal scanning line is driven, the pixel data of the 160 channels latched in latch circuit 40 are transferred to latch circuit 30.

Transistors Q3-0 to Q3-7 and Q4-0 to Q4-7 contained in output circuits 10-b to 10-160, respectively, are set ON/OFF according to the pixel data transferred to latch circuit 30. Transistors Q3-j and Q4-j connected to common node Nj are controlled so that one is ON and the other is OFF according to bit signal bj of the pixel data and its inverted signal xbj. Consequently, the mirror current generated in transistor Q2-j corresponding to reference current Iref flows via transistor Q4-j to output terminal To1, or it flows via transistor 3-j to node N8. The current from transistors Q2-0 to Q2-7 flows via transistors Q4-0 to Q4-7 to output terminal To1, and becomes the driving current of the pixel. This driving current has 256-step levels corresponding to the 8-bit pixel data {b0, . . . , b7}.

Figure 3:
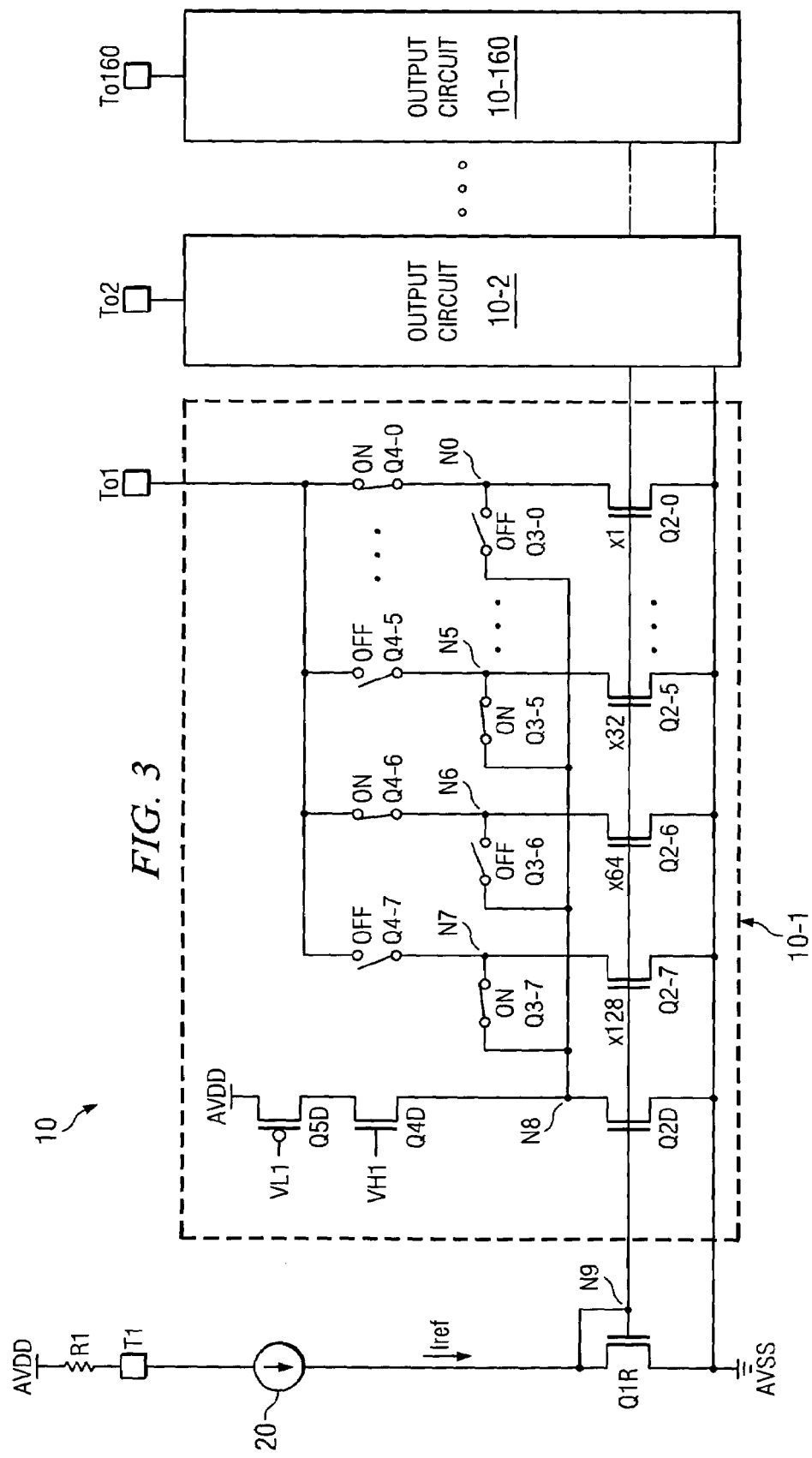
FIG. 3 is a diagram illustrating an example of the ON/OFF state of the transistor switch in the circuit shown in FIG. 2.

FIG. 3 is a diagram illustrating an example of the ON/OFF state of transistors Q3-0 to Q3-7 and Q4-0 to Q4-7. These transistors are represented by the simple symbols of switches. In the example shown in FIG. 3, because bit signals b0 and b6 of the pixel data fed to output circuit 10-1 are set at "1," transistors Q4-0 and Q4-6 in output circuit 10-b are ON, and transistors Q3-0 and Q3-6 are OFF. The mirror current of transistors Q2-0 and Q2-6 flows via transistors Q4-0 and Q4-6 to output terminal To1.

On the other hand, for the same pixel data, since bit signals b5 and b7 are set at "0," in output circuit 10-b transistors Q4-5 and Q4-7 are Off, and transistors Q3-5 and Q3-7 are ON. The mirror currents of transistors Q2-5 and Q2-7 flow via transistors Q3-5 and Q3-7 to node N8. In this way, the mirror currents of transistors Q2-0 to Q2-7 in the various output circuits keep flowing through output terminal To1 or node N8 irrespective of the setting value of the pixel data. Also, the minor current of transistor Q2D also keeps flowing in the series circuit of transistors Q4D and Q5D irrespective of the setting value of the pixel data.

Consequently, for the current driver of this embodiment, even when the setting value of the driving current varies, it is still possible to keep the currents consumed in the various output circuits constant. As a result, it is possible to prevent variation in the voltage of the power supply line in conjunction with variation of the consumed current, so that it is possible to reduce fluctuation in the driving current between output channels. Also, even in the case of driving of a single display panel using plural ICs that use the current driver in the present embodiment, it is still possible to prevent variation in the consumed current for each IC according to the design value of the pixel data. Consequently, it is possible to reduce fluctuation of the driving current among the ICs. As a result, it is possible to limit the generation of uneven luminance, lines, etc., of the picture caused by fluctuation in the driving current, so that it is possible to improve the image quality.

In the circuit shown in FIG. 2, the drain of transistor Q2-j (node Nj) is connected to output terminal To1 or node N8 according to bit signal bj of the pixel data. Node N8 has a voltage lower than power supply voltage AVDD by the voltage drop generated in the series circuit of transistors Q4D and Q5D. For example, when power supply voltage AVDD is applied to the gate of transistor Q4D, and reference potential AVSS is applied to the gate of transistor Q5D, the voltage drop generated in the series circuit of these two transistors approaches threshold voltage Vthn of transistor Q4D. Consequently, the voltage of node N8 approaches "AVDD-Vthn." On the other hand, terminal To1 has a voltage determined according to the magnitude of the driving current and the impedance of the pixel.

Consequently, by setting the impedance of the series circuit (transistors Q4D and Q5D) and the current value of transistor Q2D appropriately so that the voltage of node N8 approaches the voltage of the terminal To1, it is possible to reduce variation in the voltage of node Nj when connection between output terminal To1 as well as node N8 and node Nj is switched according to the setting value of the pixel data.

When the voltage variation of node Nj becomes smaller, voltage variation propagating through the parasitic capacitance between drain and gate of transistor Q2-j becomes smaller, so that it is possible to control variation in the mirror current of transistors Q2-0 to Q2-7.

Consequently, for the current driver of the present embodiment, it is possible to converge the variation in the driving current generated in conjunction with variation in the setting value of the pixel data quickly, and it is possible to increase the operating speed.

Figure 4:
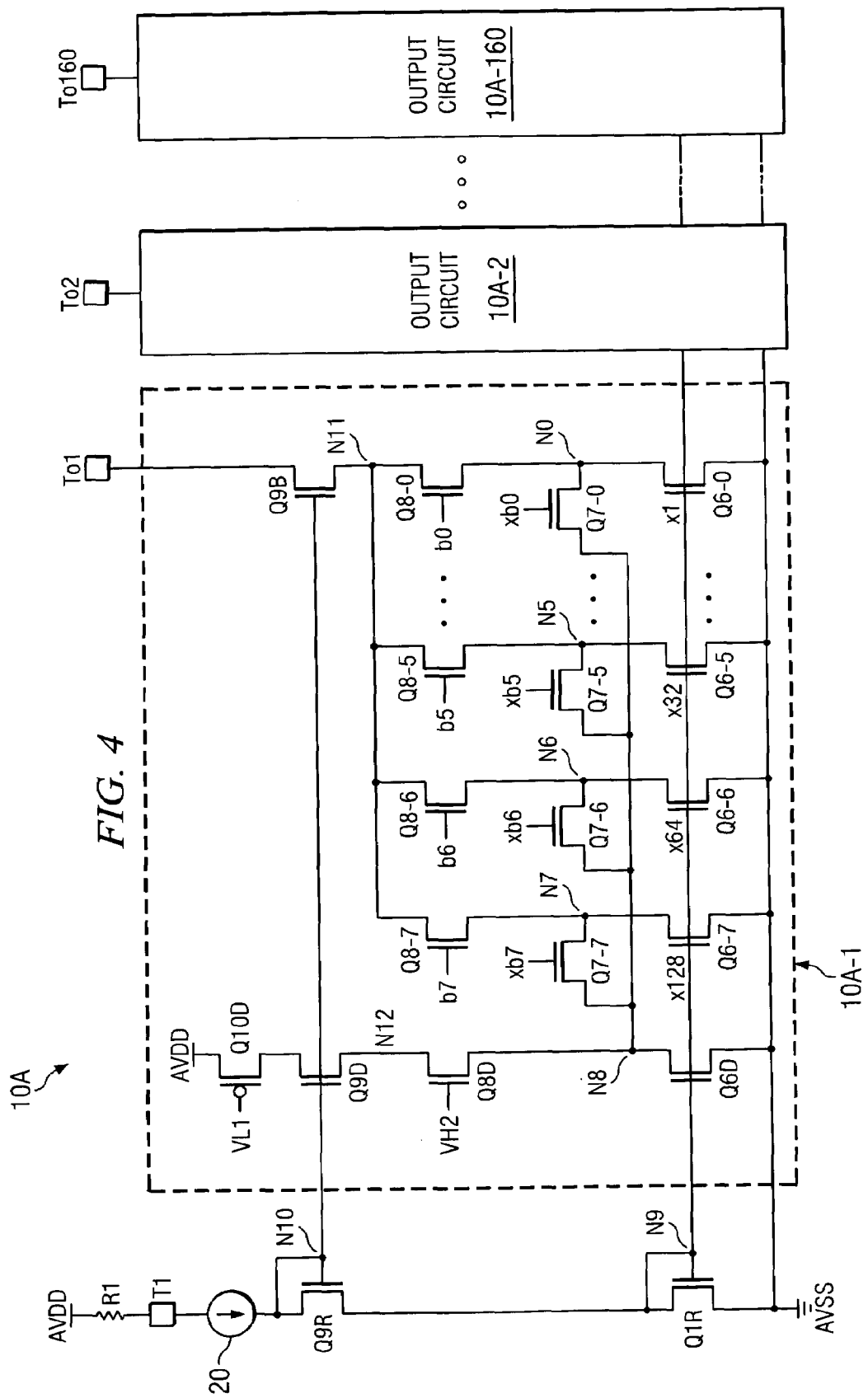
FIG. 4 is a diagram illustrating an example of the constitution of the driving current generator in the current driver in Embodiment 2.

In the following, Embodiment 2 of the present invention will be explained. FIG. 4 is a diagram illustrating an example of the constitution of driving current generator 10A in the current driver in Embodiment 2 of the present invention. The overall constitution of the current driver of this embodiment is the same as that of the current driver shown in FIG. 1. The driving current generator 10A shown in FIG. 4 has n-type MOS transistors Q1R and Q9R and output circuits b0A-1 10A-160.

Output circuit b0A-1 has n-type MOS transistors Q6-0, . . . , Q6-7, Q7-0, . . . , Q7-7, . . . , Q8-0, . . . , Q8-7, . . . , Q6D, Q8D, Q9D, Q9B, and p-type MOS transistor Q10D. Output circuits 10A-1 to 10A-160 pertain to an embodiment of the output circuits of the present invention.

N-type MOS transistors Q6-0 to Q6-7 pertain to an embodiment of the first constant current circuit of the present invention. N-type MOS transistors Q8-0 to Q8-7 pertain to an embodiment of the first switch of the present invention. N-type MOS transistors Q7-0 to Q7-7 pertain to an embodiment of the second switch of the present invention. The circuit containing N-type MOS transistors Q6D, Q8D, Q9D and p-type MOS transistor Q10D is an embodiment of the voltage output circuit of the present invention. The circuit containing N-type MOS transistors Q8D, Q9D and p-type MOS transistor Q10D pertains to an embodiment of the load circuit of the present invention. N-type MOS transistor Q6D pertains to an embodiment of the second constant current circuit of the present invention. N-type MOS transistor Q9D and p-type MOS transistor Q10D pertain to an embodiment of the first transistor of the present invention. N-type MOS transistor Q9B pertains to an embodiment of the second transistor of the present invention. N-type MOS transistor Q9R pertains to an embodiment of the third transistor of the present invention.

In the example shown in FIG. 4, MOS transistors with a low voltage rating are used in transistors Q1R, Q6-0, ..., Q6-7, Q7-0, ..., Q7-7, Q8-0, ..., Q8-7, Q6D, Q8D, and MOS transistors with a high voltage rating are used as transistors Q9R, Q9D, Q9B, Q10D. The voltage rating between terminals (between gate and source, between gate and drain, between drain and source) of transistors Q9R, Q9D, Q9B, 10D is higher than that for transistors Q1R, Q6-0, ..., Q6-7, Q7-0, ..., Q7-7, Q8-0, ..., Q8-7, Q6D, Q8D.

The drain and gate of transistor Q1R are connected to common node N9, and its source is connected to reference potential AVSS. The drain and gate of transistor Q9R are connected to common gate Nb, and its source is connected to node N9. Reference current Iref generated in reference current generator 20 is input to node Nb.

Just as with the output circuit 10-1, output circuit 10A-1 outputs a driving current to output terminal To1 of the 1th output channel. That is, a driving current having 256-step levels corresponding to the 8-bit pixel data of the 1th output channel kept in latch circuit 30 is generated arid output to output terminal To1. The gates of transistors Q6-0 to Q6-7, Q6D are connected to common node N9, and their sources are connected to reference potential AVSS.

The size ratios among transistors Q6-0 to Q6-7 are proportional to the powers of 2. That is, transistor Q6-1 is twice the size of transistor Q6-0, transistor Q6-2 is 4 times the size transistor Q6-0, transistor Q6-3 is 8 times the size of transistor Q6-0, transistor Q6-4 is 16 times the size of transistor Q6-0, transistor Q6-5 is 32 times the size of transistor Q6-0, transistor Q6-6 is 64 times the size of transistor Q6-0, and transistor Q6-7 is 128 times the size of transistor Q6-0.

Transistors Q6-0 to Q6-7, Q6D and transistor Q1R contained in output circuits b0A-b to 10A-160 form a current mirror circuit that generates plural output currents corresponding to reference current Iref. Consequently, transistors Q6-0 to Q6-7 have currents with current ratios the same as the size ratios. That is, the current of transistor Q6-i is twice that of transistor Q6-0, the current of transistor Q6-2 is 4 times that of transistor Q6-0, the current of transistor Q6-3 is 8 times that of transistor Q6-0, the current of transistor Q6-4 is 16 times that of transistor Q6-0, the current of transistor Q6-5 is 32 times that of transistor Q6-0, the current of transistor Q6-6 is 64 times that of transistor Q6-0, and the current of transistor Q6-7 is 128 times that of transistor Q6-0. Transistor 8-j is connected between the drain of transistor 6-j and node Nil. 1-bit signal bj contained in the 8-bit pixel data {b0, ..., b7} is input to the gate of transistor 8-j. Transistor 8-j is ON when bit signal bj is "1" (high level), and it is OFF when bit signal bj is "0" (low level).

Transistor 7-j is connected between node Nj connected to the drain of transistor 6-j and node N8 connected to the drain of transistor Q6D. Bit signal xbj as a logic NOT of bit signal bj is input to the gate of transistor 7-j. Consequently, transistor 7-j is ON when transistor Q8-j connected to common node Nj is OFF, and it is OFF when the transistor Q8-j is ON. Transistor Q8D is connected between node N8 and node Nb2. Voltage VH2 is input to the gate of transistor Q8D. Voltage VH2 is a voltage not higher than the voltage rating of transistor Q8D.

The source of transistor Q9D is connected to node Nl2, and its drain is connected via transistor Q10D to power supply voltage AVDD. The voltage of node N10 is input to the gate of transistor Q9D. Voltage VL1 is input to the gate of transistor Q10D. Voltage VL1 is the voltage that turns transistor Q10D ON; for example, it may be reference voltage AVSS. Transistor Q9B is connected between node Nb 1 and output terminal To1. The voltage of node N10 is input to the gate of transistor Q9B.

In the following, the operation of the current driver with this constitution will be explained. Transistors Q7-0 to Q7-7 and Q8-0 to Q8-7 contained in output circuits bA-1 to bA160, respectively, are set ON/OFF according to the pixel data transferred to latch circuit 30.

Transistors Q7-j and Q8-j connected to common node Nj are controlled so that one is ON and the other is OFF according to bit signal bj of the pixel data and its inverted signal xbj. Consequently, the mirror current generated in transistor Q6-j corresponding to reference current Iref flows via transistor Q8-j to node Nib, or it flows via transistor Q7-j to node N8. The current that flows from transistors Q6-0 to Q6-7 via transistors Q8-0 to Q8-7 to node Nib flows via transistor Q9B to output terminal To1. The driving current flowing to output terminal To1 has 256-step levels corresponding to the 8-bit pixel data {b0, ..., b7}. The mirror currents of transistors Q6-0 to Q6-7 in the various output circuits keep flowing through output terminal To1 or node N8 irrespective of the setting value of the pixel data. Also, the mirror current of transistor Q6D also keeps flowing in the series circuit of transistors Q8D, Q9D and Q10D, irrespective of the setting value of the pixel data.

Consequently, for the current driver of this embodiment, even when the setting value of the driving current varies, it is still possible to keep the currents consumed in the various output circuits constant. As a result, it is possible to control the generation of uneven luminance, lines, etc., in the picture caused by fluctuation in the driving current, so that it is possible to improve the image quality.

When transistors Q8-j are all ON and transistors Q7-j are all OFF, current flows via transistors Q10D, Q9D, Q8D, Q6D, so that the voltage level of node N8 is maintained. Also, in the circuit shown in FIG. 4, at node Nb, a nearly constant voltage is generated since the voltage between the gate and source of transistor Q1R and the voltage between the gate and source of transistor Q9R supplement each other. The constant voltage generated at node N10 is input as a common bias voltage to transistors Q9B and Q9D. Consequently, assuming the voltage between the gate and source of transistor Q9B is nearly equal to that of Q9D, nearly equal constant voltage is generated at nodes Nil and N12.

When the voltage between the drain and source of transistor Q8D can be ignored, the voltage of node N8 is nearly equal to the voltage at node Nib. On the other hand, the drain (node Nj) of transistor Q6-j is connected to node Nib or node N8 according to bit signal bj of the pixel data. Consequently, even when the connection destination of node Nj (node N8 or node Nl 1) is switched according to the setting value of the pixel data, there is still little change in the voltage of node Nj. That is, by supplying the common bias voltage to transistors Q9D and Q9B and having the voltage at N8 nearly equal to that at node Nb 1, it is possible to control the voltage variation of node Nj caused by variation in the setting values of the pixel data.

Also, by setting the current path of transistors Q10D, Q9D, Q8D, Q6D, it is possible to have the voltage at node N8 and that at node Nj stable to the same degree. Consequently, even when transistors Q7-j, Q8-j are switched according to the setting value of the pixel data, the voltage of node Nj can still be kept nearly constant. By keeping the voltage at node Nj stable, the voltage at node N9 is also kept almost constant. In this way, for the current driver of the present embodiment, the voltage variation of node N9 in conjunction with voltage variation of node Nj can be reduced, and variation in the mirror current of transistors Q6-0 to Q6-7 can be controlled. Consequently, it is possible to converge the variation in the driving current quickly when the setting value of the pixel data varies.

Also, for the current driver in the present embodiment, the constant voltage at node N10 is input to the gates of transistors Q9D and Q9B, so that nodes Nib and N12 connected to the sources of transistors Q9D and Q9B have a lower voltage than that at node Nb0 by the threshold voltage "Vthn" of the n-type MOS transistor. That is, a nearly constant voltage is generated at nodes Nb 1 and N12. Consequently, it is only required that the transistors connected between nodes Nl 1, N12 and reference potential AVSS (Q6-0, . . . , Q6-7, Q7-0, . . . , Q7-7, Q8-0, . . . , Q8-7, Q6D, Q8D) have at least the voltage rating that allows operation at the voltage of nodes Nil and N12, and there is no need to have a voltage rating high enough to enable operation at power supply voltage AVDD.

Similarly, it is only required that transistor Q1R connected between node Nb, which generates a nearly constant voltage, and reference potential AVSS have at least a voltage rating that allows operation at the voltage of the node Nb, and there is no need to have a voltage rating high enough to enable operation at power supply voltage AVDD. Consequently, for the current driver of the present embodiment, some of the transistors that form the circuit can have a low voltage rating. As a result, the operating speed is higher and the circuit area is smaller than that when all of the transistors must have a high voltage rating.

Figure 5:
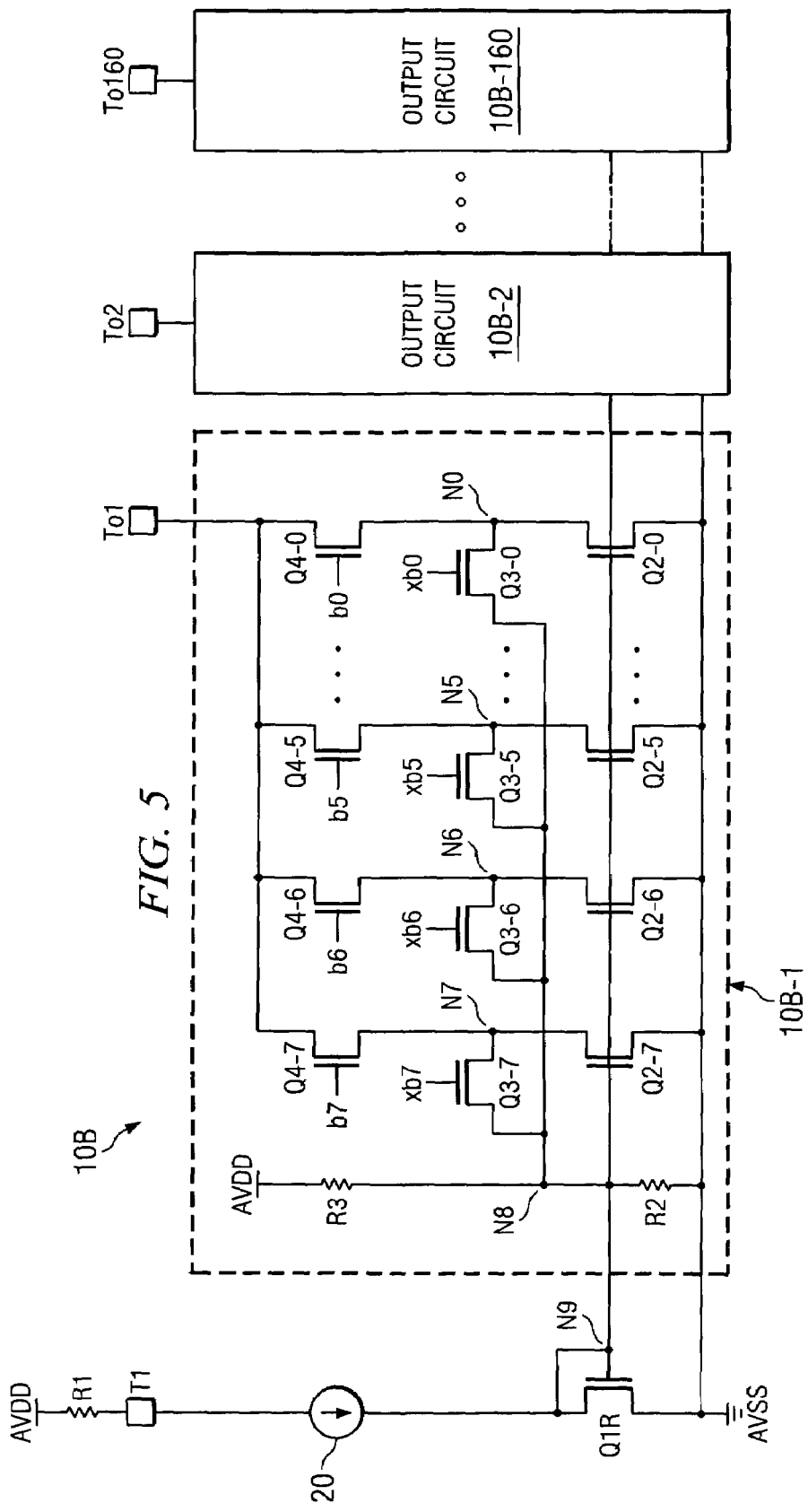
FIG. 5 is a diagram illustrating an example of the driving current generator in the current driver of Embodiment 3.

In the following, Embodiment 3 of the present invention will be explained. FIG. S is a diagram illustrating an example of the constitution of driving current generator 10B in the current driver pertaining to Embodiment 3 of the present invention. The overall constitution of the current driver of the present embodiment is the same as that of the current driver shown in FIG. 1. For the driving current generator shown in FIG. 5, output circuits 10B-1 to b0B-160 are substituted for output circuits 10-1 to 10-b 60.

In output circuits 10B-1 to 10B-160, transistors Q2D, Q4D, Q5D in output circuits 10-1 to 10-160 are omitted. Instead of these, resistors R2 and R3 are provided. Resistor R3 pertains to an embodiment of the first resistor of the present invention. Resistor R2 pertains to an embodiment of the second resistor of the present invention. Resistor R3 is connected between power supply voltage AVDD and node N8, and resistor R2 is connected between node N8 and reference potential AVSS.

In the aforementioned constitution, the current consumed in the various output circuits is kept constant irrespective of the setting value for the driving current. Consequently, in the current driver of the present embodiment, just as in the aforementioned embodiment, it is possible to reduce degradation of the image quality caused by variation in the driving current.

In the aforementioned constitution, the voltage at node N8 is the highest when all of transistors Q3-0 to Q3-7 are OFF, and it is the lowest when all of transistors Q3-0 to Q3-7 are ON. That is, when transistors Q3-0 to Q3-7 are all OFF, a divided voltage determined by the resistance ratio of resistors R2 and R3 is generated at node N8. When transistors Q3-0 to Q3-7 are all ON, the voltage at node N8 becomes lower than the divided voltage by the voltage drop at resistor R3 due to the mirror current of transistors Q2-0 to Q2-7.

Consequently, by selecting the resistance values of resistors R2 and R3 appropriately to keep the voltage at node N8 near the voltage of terminal To1, it is possible to reduce the voltage variation at node Nj when the connection between output terminal To1 as well as node N8 and node Nj is switched according to the setting value of the pixel data.

Consequently, for the current driver in this embodiment, just as in the embodiment, it is possible to control variation in the mirror current of transistors Q2-0 to Q2-7 that takes place in conjunction with variation in the setting value of the pixel data, and it is possible to increase the operating speed.

Figure 6:
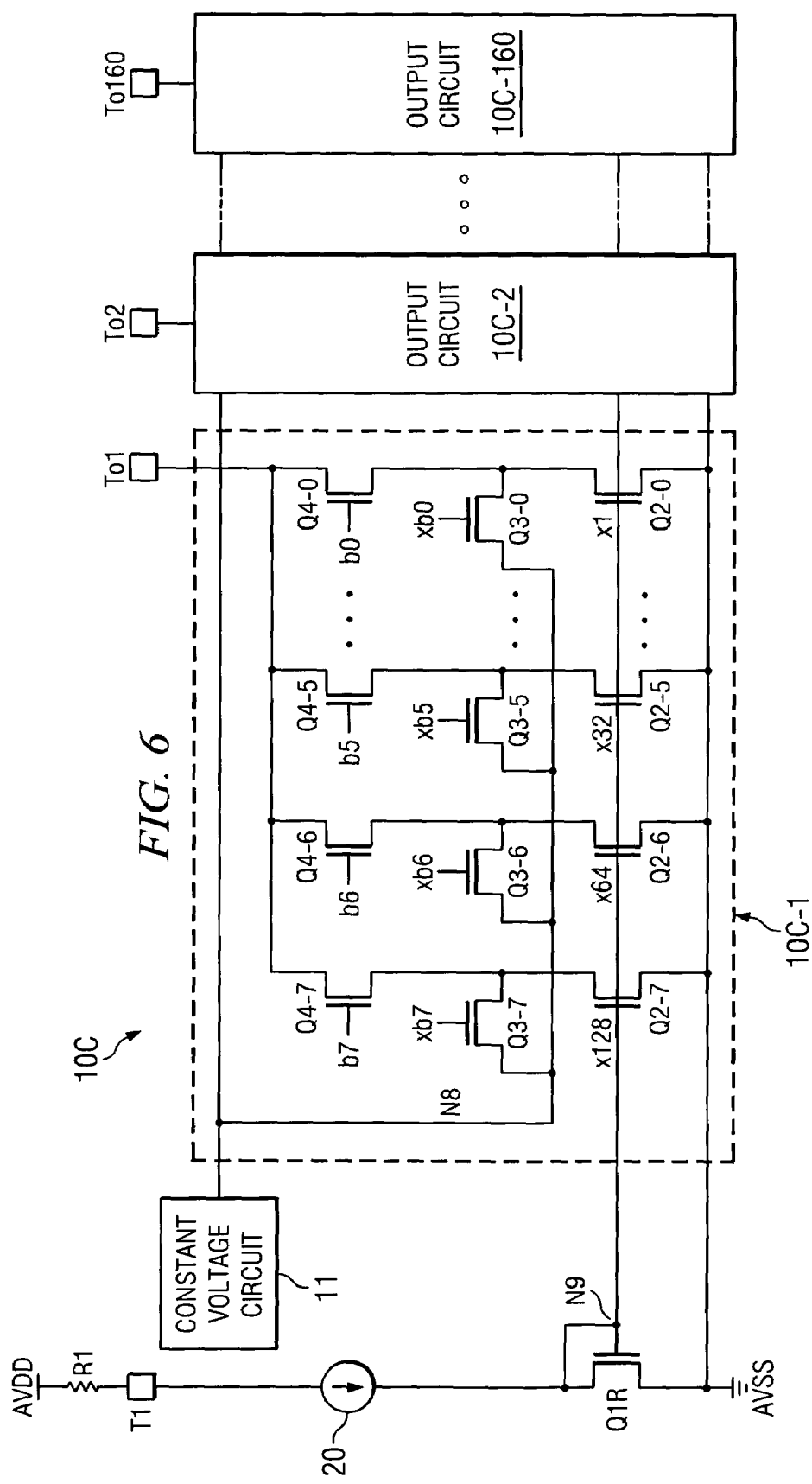
FIG. 6 is a diagram illustrating an example of the constitution of the driving current generator in the current driver of Embodiment 4.
Figure 7:
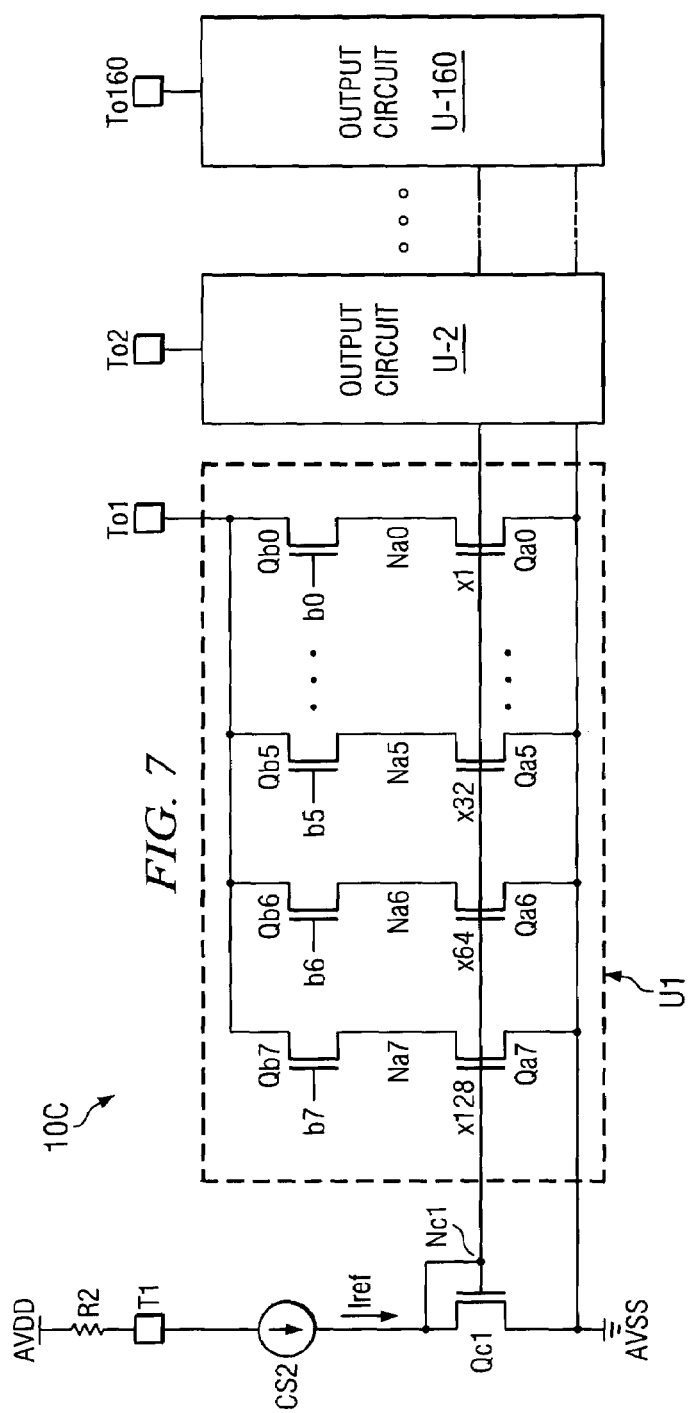
FIG. 7 is a diagram illustrating an example of the constitution of the current driver IC in the prior art that drives an active type organic EL panel.
Figure 8A:
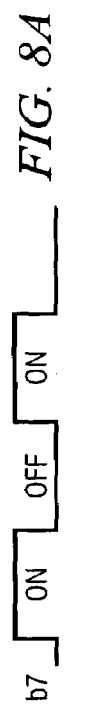
FIG. 8 is a diagram illustrating an example of the signal waveform in the current driver IC shown in FIG. 7.
Figure 8B:
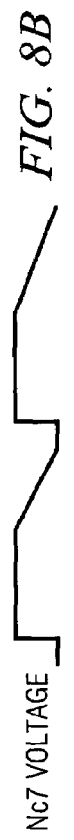
Figure 8C:

In the following, Embodiment 4 of the present invention will be explained. FIG. 6 is a diagram illustrating an example of the constitution of driving current generator 10C in the current driver pertaining to Embodiment 4 of the present invention. The overall constitution of the current driver of the present embodiment is the same as that of the current driver shown in FIG. 1.

For the driving current generator shown in FIG. 6, output circuits 10C-1 to b0C-160 are substituted for output circuits 10-1 to 10-160, and constant voltage circuit 11 is newly added. In output circuits bC-b to 10C-160, transistors Q2D, Q4D, Q5D in output circuits 10-1 to 10-160 are deleted. On the other hand, node N8, connected in common to one end of each of transistors Q3-0 to Q3-7, is connected to the output of constant voltage circuit 11. The constant voltage circuit 11 keeps node N8 of each of output circuits 10C-l to 10C-160 at a constant voltage, such as the constant voltage near the voltage of terminal To1 when the driving current is output.

In the aforementioned constitution, the voltage at node N8 is kept constant near the voltage of terminal To1. As a result, even when connection between output terminal To1 and node N8 is switched according to the setting value of the pixel data, it is still possible keep variation in the voltage at node Nj small. Consequently, in the current driver of the present embodiment, just as in the aforementioned embodiment, it is possible to control variation in the mirror current of transistors Q2-0 to Q2-7 that takes place in conjunction with variation in the setting value of the pixel data.

Also, the current consumed in each output circuit can be kept constant independently of the setting value of the driving current, just as in the aforementioned embodiments. Consequently, the current driver of the present embodiment also enables reducing degradation in the image quality caused by fluctuation in the driving current.

In the above, embodiments of the present invention have been explained. However, the present invention is not limited to the aforementioned embodiments. Various modifications may be made.

As shown in FIG. 6, for constant voltage circuit 11 that keeps node N8 at a prescribed voltage, either node N8 is always kept at the prescribed voltage, or node N8 is precharged to the prescribed voltage during a prescribed period (for example, before and during output of the driving current). Transistor switches Q3-j, Q4-j, Q7-j, Q8-j for use in setting the driving current in the output circuit may be replaced by any other switches. For example, transfer gate type switches, each composed of two transistors having different electroconductive types (such as a p-type MOS transistor and an n-type MOS transistor) connected parallel to each other may be substituted.

A transistor indicated by a single part number in any of the various figures illustrating the embodiments may be composed of any number of transistors connected in parallel. For example, transistor Q2-7 shown in FIG. 2 may be composed of 128 transistors the same size as transistor Q2-0 connected in parallel.

In the embodiments, examples are mainly for a current driver for driving single-color display panels. However, the present invention is not limited to this scheme. For example, a scheme can be adopted in which three sets of the single-color circuit constitution are provided, in the case of a current driver that can drive three colors (RGB) independently.

In the embodiments, the examples serve for current driving of a display panel. However, the present invention is not limited to display panels. For example, the current driver of the present invention can be adopted in driving various other types of devices that require multi-channel driving currents.

In the embodiments, examples make use of n-type MOS transistors. However, the present invention is not limited to this scheme. For example, p-type MOS transistors can be adopted. In the aforementioned examples using n-type MOS transistors, the driving current is drawn from the pixels to output circuits 10-1 to 10-160. When p-type MOS transistors are used, however, driving current flows out of the output circuits 10-1 to 10-160. In this case, one may connect reference current generator 20 and externally connected resistor R1 on the side of reference potential AVSS.

Also, the transistors used in the present invention are not limited to MOS transistors. For example, bipolar transistors and various other types of active elements can also be used.

The specific numbers in the aforementioned embodiments (output channel number, bit length of the pixel data, etc.) are merely examples for explanation. The present invention is not limited to this scheme. For example, other numbers can be adopted in place of these numbers.

The invention claimed is:

1. A type of current driver comprising:
    plural output circuits that output driving currents, respectively,
    each output circuit having;
        a first node that outputs the driving current;
        a first constant current circuit that has plural current output nodes for output of a prescribed current;
        plural first switches, which are connected between the current output nodes of the first constant current circuit and the first node, and which are turned ON/OFF according to the setting signal of the driving current;
        a voltage output circuit; and
        and plural second switches, which are connected between the current output nodes of the first constant current circuit and the voltage output node of the voltage output circuit, and which are turned ON when the first switch connected to a common current output node is OFF, and are turned OFF when the first switch is ON.

2. The current driver described in claim 1, wherein the voltage output circuit has:
    a first constant voltage node that applies a constant voltage;
    a load circuit, which is connected between the first constant voltage node and the voltage output node, and which generates a voltage corresponding to the current flowing between the nodes; and
    a second constant current circuit that outputs to the voltage output node a prescribed current at the same polarity as that of the current output from the first constant current circuit via the second switch to the voltage output node.

3. The current driver described in claim 2, wherein the load circuit contains at least one series-connected first transistors, which are connected between the first constant voltage node and the voltage output node, and which have a prescribed bias voltage applied to their control terminals.

4. The current driver described in claim 3, wherein further comprising:
    second transistor, which is inserted in the wiring for connecting the current output node of the first constant current circuit and the first node, and which has a prescribed bias voltage applied to its control terminal; and wherein
    the first transistor and the second transistor have a higher voltage rating between terminals than that of the transistors that form the first constant current circuit and the second constant current circuit.

5. The current driver described in claim 4, wherein the first transistor and the second transistor have a common bias voltage input to their control terminals.

6. The current driver described in claim 4, wherein the first constant current circuit and the second constant current circuit are contained in a common current mirror circuit that generates output current at the current output nodes corresponding to the input current; and further comprising
    an input node for a reference current;
    a third transistor, which is connected between the current input node of the current mirror circuit and the input node of the reference current, a control terminal connected to the input node of the reference current, and which has a voltage rating between terminals higher than that of the transistors that form the current mirror circuit.

7. The current driver described in claim 6, wherein the first transistor and the second transistor have the voltage generated at the control terminal of the third transistor input as the bias voltage.

8. The current driver described in claim 2, wherein the load circuit contains a resistor element connected between the first constant voltage node and the voltage output node.

9. The current driver described in claim 1, wherein the voltage output circuit contains;
    a first constant voltage node and a second constant voltage node, each having a prescribed voltage applied to them;
    a first resistor element connected between the first constant voltage node and the voltage output circuit; and
    a second resistor element connected between the voltage output node and the second constant voltage node.

10. The current driver described in claim 1, wherein the voltage output circuit maintains a constant output voltage.

11. A type of current driver comprising:
    a current driver having a current supply terminal;
    a reference current source generating a reference current;
    a first transistor having the reference current as an input;
    a second transistor connected to the first transistor supplying a current having a prescribed relationship to the current flowing in the first transistor;
    plural third transistors each connected to the first transistor and supplying a current having a prescribed relationship to the current flowing in the first transistor;
    plural first switching elements arranged in the plural current paths between the current supply terminal and the plural third transistors, respectively, and turned ON/OFF according to the output data;
    and plural second switching elements arranged between the plural current paths, which are between the current supply terminal and the plural third transistors, and the current path of the second transistor; and
    the plural first switching elements and the plural second switching elements in corresponding relationship with each other, respectively, being controlled ON/OFF in a complementary way according to the output data.

12. The current driver described in claim 11, wherein the first transistor, the second transistor, and the plural third transistors form a current mirror circuit.

13. The current driver described in claim 11, wherein currents that can be fed to the plural third transistors are currents corresponding to the gradation data.

14. The current driver described in claim 11, further comprising:
a fourth transistor arranged in the current path of the first transistor, a fifth transistor arranged in the current path of the second transistor, and a sixth transistor arranged in the current path of the current supply terminal; the fourth, fifth, and sixth transistors may form a current mirror circuit.

15. The current driver described in claim 11, wherein the plural first and second switching elements are each composed of transistors.

16. The current driver described in claim 14, wherein the first, second and third transistors are transistors with a low voltage rating, and the fourth, fifth and sixth transistors are transistors with a high voltage rating.

17. The current driver described in claim 12, wherein currents that can be fed to the plural third transistors are currents corresponding to the gradation data.

18. The current driver described in claim 12, further comprising:
a fourth transistor arranged in the current path of the first transistor, a fifth transistor arranged in the current path of the second transistor, and a sixth transistor arranged in the current path of the current supply terminal; the fourth, fifth, and sixth transistors may form a current mirror circuit.

19. The current driver described in claim 12, wherein the plural first and second switching elements are each composed of transistors.

20. The current driver described in claim 12, wherein the first, second and third transistors are transistors with a low voltage rating, and the fourth, fifth and sixth transistors are transistors with a high voltage rating.

* * * * *